(12) United States Patent
Trotta et al.

(10) Patent No.: US 9,337,522 B2
(45) Date of Patent: May 10, 2016

(54) MILLIMETER-WAVE SYSTEM INCLUDING A WAVEGUIDE TRANSITION CONNECTED TO A TRANSMISSION LINE AND SURROUNDED BY A PLURALITY OF VIAS

(71) Applicant: Infineon Technologies AG, Neubiberg (DE)

(72) Inventors: Saverio Trotta, Munich (DE); Jagjit Singh Bal, Ottobrunn (DE); Maciej Wojnowski, Munich (DE); Ernst Seler, Munich (DE); Mehran Pour Mousavi, Munich (DE)

(73) Assignee: Infineon Technologies AG, Neubiberg (DE)

( * ) Notice: Subject to any disclaimer, the term of this patent is extended or adjusted under 35 U.S.C. 154(b) by 56 days.

(21) Appl. No.: 14/067,640

(22) Filed: Oct. 30, 2013

(65) Prior Publication Data
US 2015/0117862 A1 Apr. 30, 2015

(51) Int. Cl.
| | |
|---|---|
| *H01P 5/107* | (2006.01) |
| *H01P 3/12* | (2006.01) |
| *H04B 10/2575* | (2013.01) |
| *H04B 10/572* | (2013.01) |
| *H05K 1/02* | (2006.01) |
| *H05K 1/11* | (2006.01) |
| *H05K 1/18* | (2006.01) |
| *H05K 3/46* | (2006.01) |

(52) U.S. Cl.
CPC *H01P 5/107* (2013.01); *H01P 3/12* (2013.01); *H04B 10/2575* (2013.01); *H04B 10/572* (2013.01); *H05K 1/024* (2013.01); *H05K 1/0206* (2013.01); *H05K 1/0242* (2013.01); *H05K 1/0251* (2013.01); *H05K 1/116* (2013.01); *H05K 1/181* (2013.01); *H05K 3/4697* (2013.01)

(58) Field of Classification Search
CPC .......................................................... H01P 5/107
USPC ................................................... 333/26, 247
See application file for complete search history.

(56) References Cited

U.S. PATENT DOCUMENTS

| | | | |
|---|---|---|---|
| 7,696,941 B2 | 4/2010 | Cunningham, Jr. | |
| 9,184,505 B2 | 11/2015 | Han et al. | |
| 2007/0262828 A1* | 11/2007 | Fujita | 333/26 |
| 2010/0308942 A1* | 12/2010 | Shmuel | 333/254 |
| 2011/0057741 A1* | 3/2011 | Dayan et al. | 333/26 |
| 2011/0175793 A1* | 7/2011 | Suzuki | 343/905 |
| 2013/0088396 A1* | 4/2013 | Han | 343/700 MS |
| 2014/0291835 A1* | 10/2014 | Demin et al. | 257/737 |

FOREIGN PATENT DOCUMENTS

KR   20130055281 A   5/2013

OTHER PUBLICATIONS

Trotta, S. et al., "An RCP Packaged Transceiver Chipset for Automotive LRR and SRR Systems in SiGe BiCMOS Technology," IEEE Transactions on Microwave Theory and Techniques, vol. 60, No. 3, Mar. 2012, pp. 778-794.

de Lera Acedo, E. et al., "Study and Design of a Differentially Fed Tapered Slot Antenna Array," IEEE Transactions on Antennas and Propagation, vol. 58, No. 1, Jan. 2010, 17 pages.

* cited by examiner

*Primary Examiner* — Benny Lee
(74) *Attorney, Agent, or Firm* — Slater Matsil, LLP (57) ABSTRACT

According to an embodiment, a circuit board includes a signal line including at least portion of a first conductive layer that has a first portion extending over a cavity in the circuit board from a first side of the cavity. The circuit board also includes a first plurality of conductive vias surrounding the cavity and the first plurality of vias include at least one blind via disposed adjacent to the first side of the cavity.

25 Claims, 9 Drawing Sheets

MILLIMETER-WAVE SYSTEM INCLUDING A WAVEGUIDE TRANSITION CONNECTED TO A TRANSMISSION LINE AND SURROUNDED BY A PLURALITY OF VIAS

TECHNICAL FIELD

The present invention relates generally to circuit boards, and, in particular embodiments, to a system and method for a millimeter wave circuit board.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

As the operating frequencies of RF systems continue to increase, however, the generation of signals at such high frequencies poses a number of major challenges. One such challenge in the interfacing of millimeter wave signals to and from integrated circuits. At high frequencies, bond wires, package contacts, printed circuit board (PCB) traces, board capacitance, and other parasitics may potentially cause attenuation and mismatch of high frequency RF signals. In some systems, such as automotive radar systems, circuit boards interface with a high-frequency radar antenna using a waveguide in order to prevent signal losses.

In higher power millimeter wave systems, additional issues may arise with respect to thermal management. For example, circuit components configured to deal with high power may have wider conductive layers to withstand high currents and thermal dissipation structures such as vias in order to conduct heat away from a high power part. These conductive layers and thermal dissipation structures may increase parasitic capacitances and inductances that may degrade RF performance.

SUMMARY OF THE INVENTION

According to an embodiment, a circuit board includes a signal line including at least portion of a first conductive layer that has a first portion extending over a cavity in the circuit board from a first side of the cavity. The circuit board also includes a first plurality of conductive vias surrounding the cavity and the first plurality of vias include at least one blind via disposed adjacent to the first side of the cavity.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Description is made with respect to various embodiments in a specific context, namely an embedded system, and more particularly, to a millimeter wave circuit board. Some of the various embodiments described herein include radio frequency (RF) transceivers, circuit boards, printed circuit boards (PCB), PCBs with embedded antennas, thermal management on a PCB and bonded IC, waveguides, waveguide shielding, and others. Many embodiments herein are described with signals having frequencies in the RF range and particular applications may focus on radio signals with millimeter (mm) wavelength signals, which generally correspond to RF signals with GHz frequencies. In other embodiments, aspects may also be applied to other applications involving any type of embedded system and circuit board according to any fashion as known in the art.

In accordance with an embodiment, a circuit board includes a waveguide and an interface between the waveguide and an integrated circuit (IC) that facilitates signals in the millimeter wave range having frequencies, for example, above 30 GHz. The waveguide is constructed from a cavity in the circuit board that is surrounded by vias having a pitch of less than a quarter wavelength (λ/4) of the RF signal. These vias form the electrical "walls" of the waveguide and may include through vias that extend from a top conductive layer to a bottom conductive layer of the circuit board, and may contain blind vias that extend from one side of the circuit board to an intermediate conductive layer. These blind vias may be disposed beneath a conductive line that is used to feed a signal into the waveguide. In some embodiments, it is not necessary to plate the walls of the cavity with a conductive material.

In an embodiment, the conductive line used to feed the signal to the waveguide is coupled to an IC landing pad via a transmission line that may be a differential transmission line having a defined impedance. Alternatively, a single ended transmission line may be used. The transmission line may be surrounded by through vias to ensure that a top conductive layer of the circuit board layer and a bottom conductive layer of the circuit board have a low impedance path between them in the proximity of the transmission line. In areas of the circuit board that are physically tight and crowded, the diameter of the through vias may be reduced in order to maintain coupling between the top and bottom conductive layers.

The IC landing pad coupled to the transmission line and waveguide may be positioned adjacent to through vias that are positioned to underneath the IC. These vias positioned between the IC may perform a double duty of transferring heat from the IC and improving the HF transition.

According to an embodiment, a circuit board including embedded waveguides having sidewalls formed by vias is presented herein. The circuit board includes an IC landing for bonding an IC though a ball grid array (BGA) to the circuit board. A combination of positioning of through vias and microvias with a particular layering of materials produces a circuit board with improved thermal, electrical, structural, and RF performance.

Figure 1:
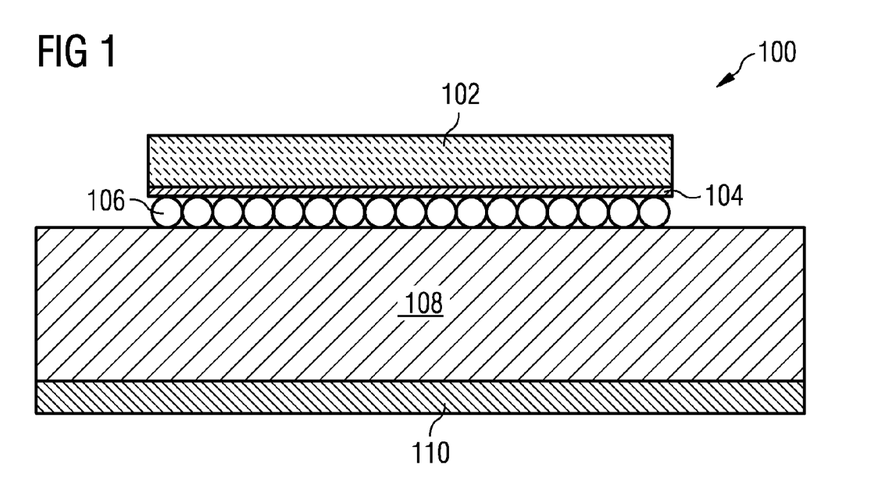
FIG. 1 illustrates a cross-sectional schematic of an embodiment chip stack.

FIG. 1 illustrates a cross-sectional diagram of an embodiment system 100 that includes IC 102, redistribution layer 104, BGA 106, PCB 108, and heat spreader 110. IC 102 may be any type of chip, wafer, or circuit package. In various embodiments, IC 102 includes analog or digital electronics for transmitting and receiving signals via a waveguide, which may be included in the PCB 108. BGA 106 provides connections between PCB 108 and IC 102, and may include solder balls that provide electrical and thermal connections. In some embodiments, IC 102 is flip-chip bonded to PCB 108 by BGA 106. In order to dissipate heat generated in IC 102, thermal connections are provided with the solder balls. In some embodiments, the thermal connections are also coupled to ground. For additional thermal dissipation, through vias (not shown) may be included in PCB 108 that couple to heat spreader 110. In some embodiments, the redistribution layer 104 may be omitted.

Figure 2A:
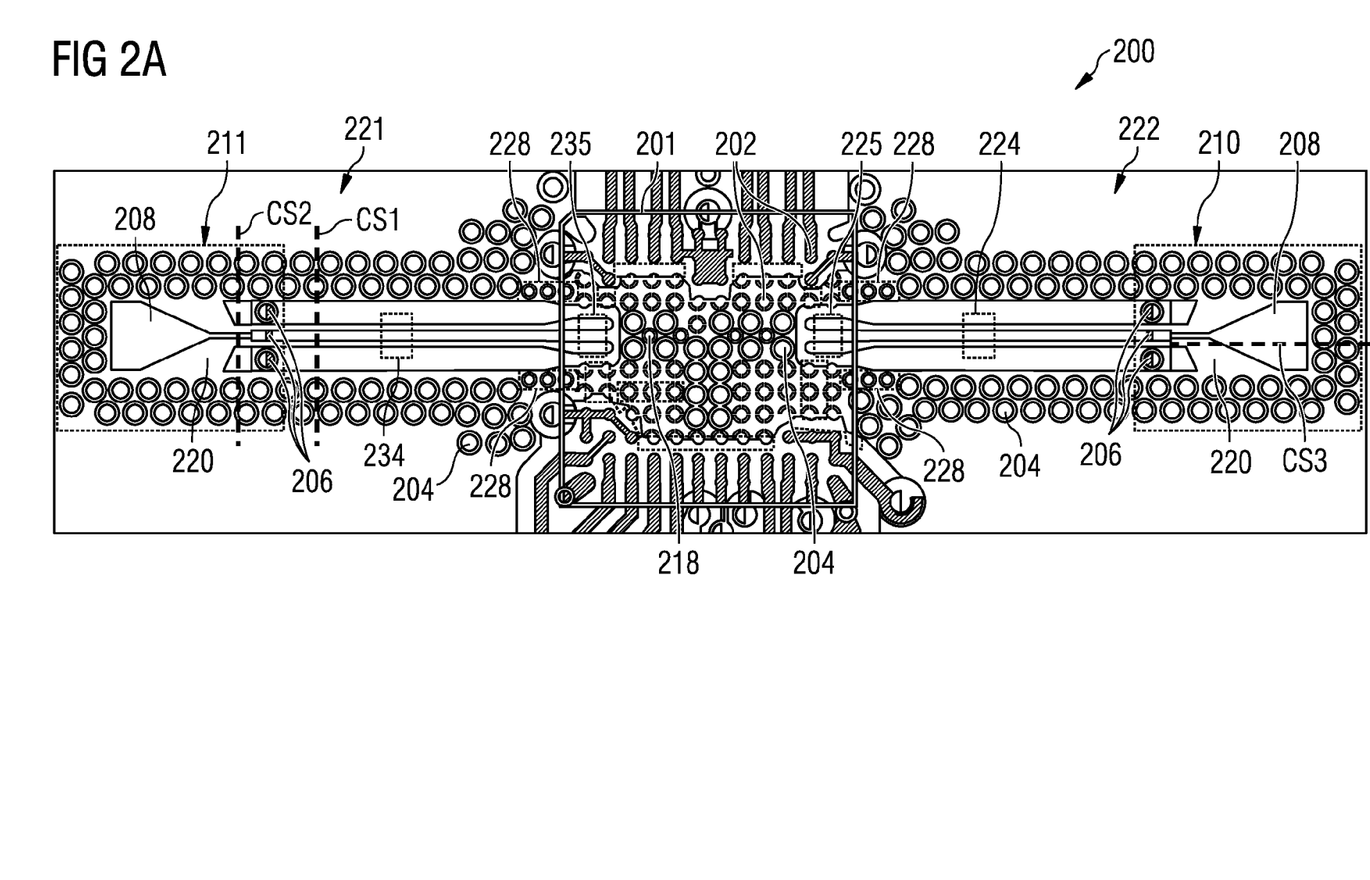
FIG. 2a illustrates a detailed layout view of an embodiment circuit board.

FIG. 2a illustrates a layout view of an embodiment circuit board 200 for an RF transmission system such as a radar system. Circuit board 200 includes a chip contact or landing area 201 for a radio frequency (RF) integrated circuit, and two waveguides 210 and 211 implemented as cavities within circuit board 200. Waveguide 210 is coupled to landing pads 225 via transmission line 224. In an embodiment, landing pads 225 correspond to interface pins used for an RF input or output on the IC. As shown, transmission line 224 is a differential signal line; however, the transmission line 224 may be implemented as a single ended transmission line in alternative embodiments. In some embodiments, RF signals having millimeter wavelengths, i.e. frequencies on the order of 10s or 100s of GHz, are transmitted and received on circuit board 200 by the IC. Circuit board 200 also includes chip landing area 201, additional landing pads 202 for other IC connections, through vias 204, blind vias 206, and microvias 218, which will be described in more detail herein below with reference to the other figures. In order to more clearly explain the structure of waveguide 210 and circuit board 200, cross sections CS1, CS2, and CS3 are also described below with reference to FIGS. 5a, 5b, and 5c, respectively.

According to various embodiments, RF signals propagating in space are transmitted by a cavity 208 in waveguide 210, which includes cavity 208 and the surrounding through vias 204. In some embodiments, waveguide 210 guides the RF signals through cavity 208 to waveguide transition 220 formed of a conductive material overlying the cavity. Waveguide transition 220, which may be implemented as a tapered slot antenna (TSA), transitions coupled waveguide 210 to transmission line 224 and landing pads 225, which interface with a BGA package as shown in FIG. 1 and will be described further herein below. In various embodiments, the transmission portion 222 of circuit board 200 includes the elements on the right side of FIG. 2a, including landing pads 225, transmission line 224, and waveguide 210, whereas reception portion 221 includes the elements on the left side of FIG. 2a, including landing pads 235, transmission line 234, and waveguide 211. According to various embodiments, reception portion 221 and transmission portion 222 may include identical or similar structures or may be implemented with different structures. According to some embodiments, at the transitions between cavities 208 and transmission lines 224, through vias and/or blind vias 206 may be implemented as walls for waveguide 210.

In some embodiments, the through vias 204 and microvia sets 228 surrounding waveguide 210, transmission line 224, and landing pads 225 may have the following functions: (1) the vias function as electromagnetic shielding and walls to the waveguides 210 and transmission lines 224; (2) the vias function to thermally couple heat generating components on a top surface of circuit board 200 to a heat spreader on a bottom surface of circuit board 200; and (3) the vias and the microvia sets 228 provide firm coupling of a ground plane to ground connections, as described below in reference to FIG. 2c.

According to various embodiments, through vias 204 are separated from one another by a distance of $\lambda/4$ from the nearest adjacent through vias 204, where $\lambda$ is the wavelength of a particular frequency of operation. In various embodiments, $\lambda$ may be on the order of millimeters. Thus, the distance between through vias may be on the order of millimeters or less. In a specific embodiment, an operating frequency on the order of 80 GHz may be used. The corresponding wavelength of about 3-5 mm yields a distance between through vias of about 1 mm or less. Microvias 218 are also placed a distance of less than $\lambda/4$ from through vias 204 and from other microvias 218. Particularly, the microvias in microvia sets 228 may be placed so as to be separated by a distance of less than $\lambda/4$ from the other microvias in the microvia set 228 and the adjacent through vias 204. According to some embodiments, microvias 218 have a smaller diameter than through vias 204 and may be placed in tight or constricted locations throughout circuit board 200.

In some embodiments, the spacing of through vias 204 is especially relevant for the through vias surrounding reception portion 221 and transmission portion 222. As shown, a plurality of through vias 204 forms a via enclosure or via fence around receiver 221 and transmitter 222, including transmission line 224, landing pads 225, and cavity 208. In some embodiments, two rows of through vias may be used, as shown. In other embodiments, more or less than two rows surrounding reception portion 221 and transmission portion 222 may be used. With respect to cavity 208, though vias 204 and blind vias 206 form electrical walls of a waveguide. In some embodiments, the interior walls of cavity 208 are left unplated.

Figure 2B:
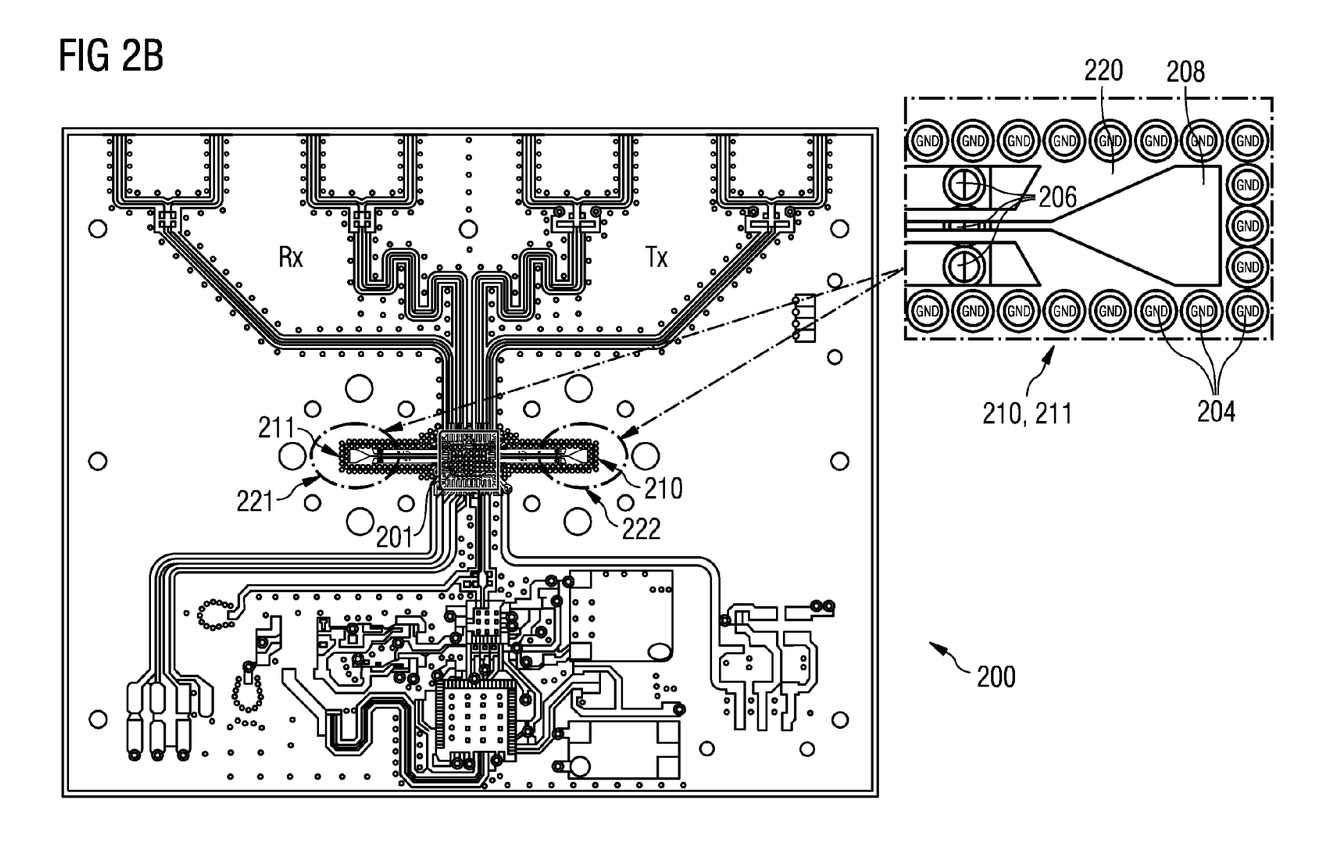
FIG. 2b illustrates a layout view of an embodiment circuit board.

FIG. 2b illustrates a layout view of an embodiment circuit board 200 that includes two waveguides 210 and 211 and IC landing area 201. IC landing area 201 corresponds to the location of IC 102 on PCB 108 in FIG. 1. In various embodiments, an IC die or die stack may be bonded to IC landing area 201. As shown, adjacent IC landing area 201 on the left and the right are reception portion 221 and transmission portion 222, which each include waveguides 210 and 211. In various embodiments, waveguides 210 and 211 include through vias 204, blind vias 206, cavities 208, and waveguide transitions 220. In some embodiments, waveguide transitions 220 may be tapered slot antennas (TSA). In further embodiments, waveguide transitions 220 may be Vivaldi type. In other embodiments, waveguide transitions 220 may be implemented as other types of antennas. According to various embodiments, waveguide transitions 220 are embedded in circuit board 200. Circuit board 200 may correspond to PCB 108 in FIG. 1.

Figure 2C:
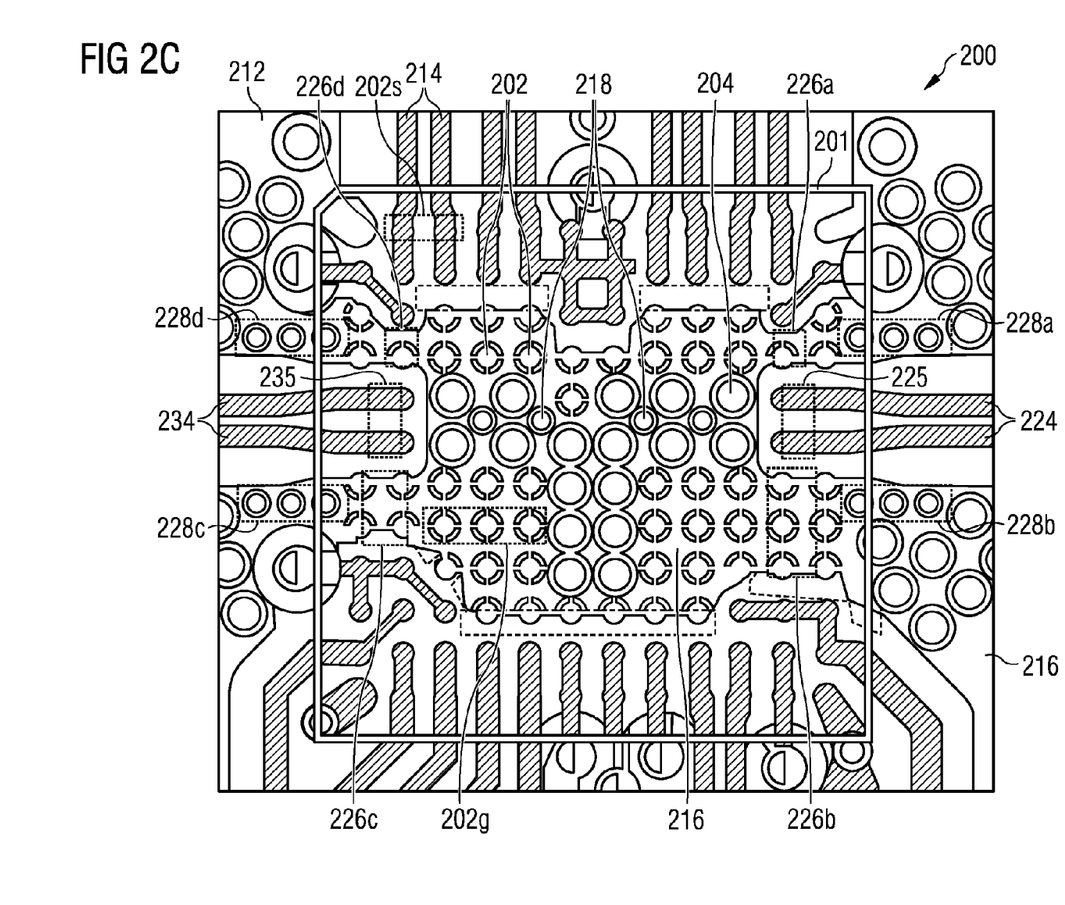
FIG. 2c illustrates a more detailed layout view of an embodiment circuit board.

FIG. 2c illustrates a more detailed layout view of the circuit board 200 of FIG. 2a. In various embodiments, IC landing area 201 includes landing pads 202 and through vias 204. Landing pads 202 may be used as contact points to which a BGA is affixed in order to bond a chip or IC on IC landing area 201. Material 212 may be a conductive material, such as copper, that couples specific landing pads 202 to electrical routing on circuit board 200. Material 212 may couple landing pads 202 to input and output (I/O) pins or pads, ground connections, or power supply connections throughout circuit board 200. For example, leads 214 that are coupled to landing pads 202s may couple to various I/O and carry signals whereas landing pads 202g may be coupled directly to a ground plane.

According to various embodiments, through vias 204 may serve at least three functions: (1) transferring thermal energy (heat) from a top side of circuit board 200 to a heat spreader on a bottom side of circuit board 200, (2) providing a low impedance path between ground plane 216 and ground connections on the bottom side of circuit board 200, and (3) providing electromagnetic shielding for EMR transmitters and receivers. In some embodiments, smaller vias may be placed throughout circuit board 200 to provide grounding and shielding in physically tight areas. Such smaller vias, depicted as microvias 218, may also serve the three purposes listed. In alternative embodiments, microvias may be placed beneath landing pads 202.

By way of further explanation in reference to ground plane 216, because parasitic inductance and capacitance may be prominent in short wires and metal connections at high frequency, ground planes may be coupled to ground at multiple locations. For example, region 226a may be a narrow section of material 212 that is coupled to ground plane 216. When circuit board 200 operates above 30 GHz, for example, at 80 GHz in the case of some communication backhaul systems, the inductance and/or capacitance of region 226a may become significant to attenuate, imbalance, or otherwise affect the signal on differential lines 224. Thus, microvia set 228a may be placed proximal to region 226a in order to more firmly couple ground plane 216 to ground connections near region 226a. In such an embodiment, the effects of parasitic inductance and/or capacitance in region 226a may be reduced by a more firm and more proximal ground connection produced by microvia set 228a. Similar effects may be observed near microvia sets 228b, 228c, and 228d placed proximal to regions 226b, 226c, and 226d, respectively. In some embodiments, such as near microvia set 228b, region 226b may be less narrow than other regions, such as region 226a, and have decreased parasitic impedances. Layout of narrow and broad interconnections with material 212, such as in regions 226a, 226b, 226c, and 226d, for example, is determined by I/O and system requirements, but particular improvements with reference to the above three purposes may be obtained by embodiments described herein.

In various embodiments, transmission line 224 may be composed of parallel strips of material 212 as shown. Microvia sets 228a, 228b, 228c, and 228d and through vias 204 arranged along sides of transmission line 224 may provide shielding against signal degradation due to EMR interference and leakage and provide a stable impedance environment for transmission line 224. In some embodiments, the particular placement of microvia sets 228a, 228b, 228c, and 228d parallel to transmission line 224 near landing pads 225 may provide improved performance and shielding.

Figure 3:
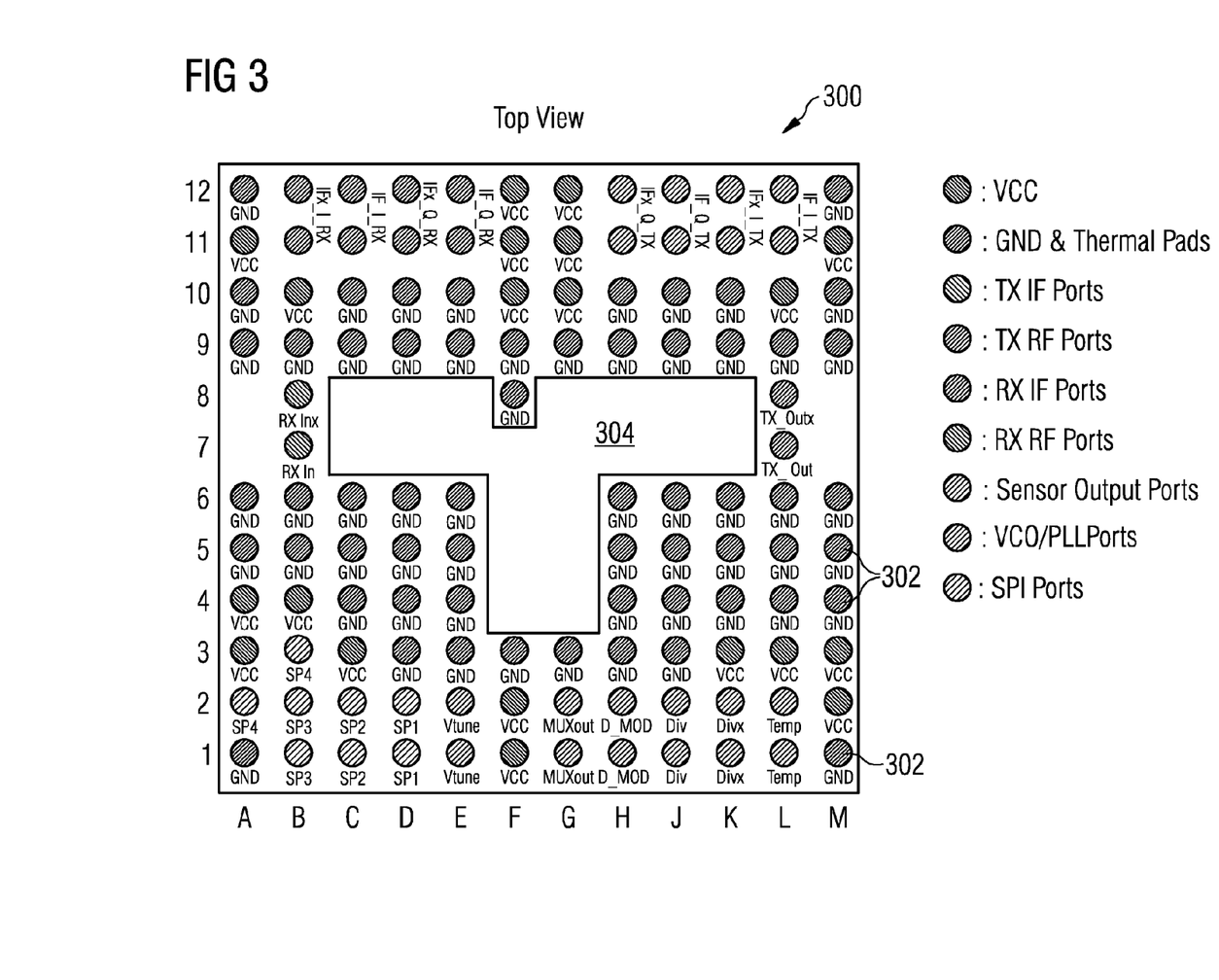
FIG. 3 illustrates a diagram of an embodiment ball grid array distribution.

FIG. 3 illustrates a diagram of an embodiment ball grid array (BGA) pin distribution 300 that indicates various types of connections with a circuit board, such as PCB 108 or circuit board 200 in FIGS. 1 and 2, respectively. For example, BGA pin distribution 300 may correspond with and be coupled to landing pads 202 in chip landing area 201 of FIG. 2. BGA pin distribution 300 is illustrated from the perspective of the top view (as indicated by the label Top View in FIG. 3). BGA pin distribution 300 may include rows of the array labeled 1, 2, 3, 4, 5, 6, 7, 8, 9, 10, 11, and 12 and may include columns of the array labeled A, B, C, D, E, F, G, H, J, K, L, M, as shown. In some embodiments, a large number of ground pads 302 are distributed throughout BGA pin distribution 300. As indicated herein, ground pads 302 are also useful for thermal transfer. In various embodiments, heat generated in a chip or IC is transmitted through ground pads 302 to a circuit board on which the IC is coupled. As indicated by the illustrated embodiment, spacing region 304 may be situated, free of interconnection pads, throughout the center of BGA pin distribution 300. In various embodiments, spacing region 304 is left free of interconnection pads in order to provide room for through vias, such as though vias 204 shown in FIG. 2. Spacing region 304 may correspond to through vias 204 located in the center of chip landing area 201. Other possible interconnection pads are indicated and labeled in FIG. 3. Various exemplary identifying pad labels in BGA pin distribution 300 are indicated, including GND, VCC, IF_I_RX, IFx_I_RX, IF_Q_RX, IFx_Q_RX, IF_Q_TX, IFx_Q_TX, IF_I_TX, IFx_I_TX, RX Inx, RX In, TX_Outx, TX_Out, SP1, SP2, SP3, SP4, Vtune, MUXout, D_MOD, Div, Divx, and Temp, which correspond to ports identified in the legend of FIG. 3.

BGA pin distribution 300 in conjunction with system 100 in FIG. 1 demonstrates a general structure that is useful to illustrate certain features. In certain embodiments, solder balls and through vias are not placed in the same location such that a certain number of locations are chosen to have solder balls, as shown by BGA pin distribution 300, and a certain number of locations are chosen to have through vias, which may correspond to spacing region 304. Thus, a tradeoff exists between thermal transfer from IC 102 to PCB 108 and from PCB 108 to heat spreader 110 in FIG. 1.

According to various embodiments, the pad distribution of BGA pin distribution 300 varies dependent on a specific IC or chip that is to be bonded to a circuit board through a BGA. In a particular BGA embodiment, 119 landing pads are used, 55 of which are ground pads coupled to a ground plane. In some embodiments, a subset of the landing pads are connected together by a continuous region of a top conductive layer of the circuit board. This subset of landing pads may include at least 27 landing pads in some cases. In addition, 17 through vias may are placed throughout and near a center of the chip landing. In other embodiments, any number of landing pads, ground pads and vias may be used depending on the specific embodiment and its requirements. In some embodiments, the through vias may each a diameter of between about 100 μm and 700 μm, for example, about 400 μm. These though vias may also function as thermal vias and may be coupled to a heat sink attached to the bottom of the circuit board.

According to further embodiments, a ground plane may be formed of a conductive material on a bottom surface of the circuit board in order to improve thermal dissipation. In one specific embodiment the ground plane is about 8.5 mm$^2$, however any size may be used depending on the particular embodiment and its specifications. In such an embodiment, ground pads 302 are coupled to a conductive material forming the ground plane on a top surface of the circuit board through landing pads in the chip landing and through vias couple the ground plane on the top surface to the ground plane on the bottom surface. In some embodiments, a plurality of microvias is placed between through vias in the chip landing within spacing region 304. Such microvias may have a diameter of between about 200 um and about 400 um, for example, or approximately 250 μm.

Figure 4:
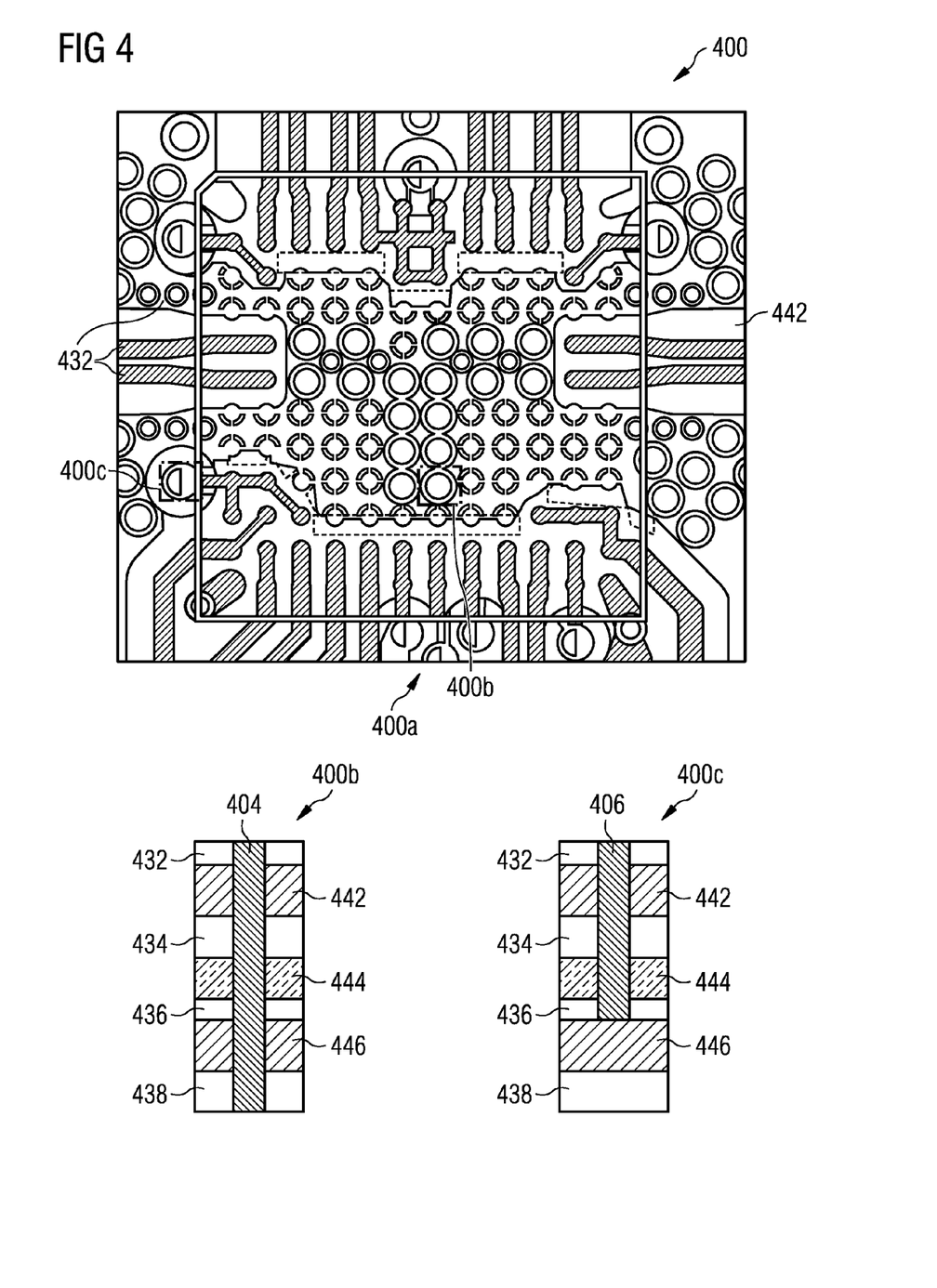
FIG. 4 illustrates two cut-away layered cross-sections and a top view of an embodiment circuit board.

FIG. 4 illustrates a top view and two cut-away cross-sections of an embodiment circuit board 400 that includes top view 400a and cut-away cross-sections 400b and 400c. In various embodiments, circuit board 400 may correspond to circuit board 200 in FIG. 2. Cross-section 400b depicts a through via 404 and cross-section 400c depicts a blind via 406. From top view 400a, the locations of cross-sections 400b and 400c can be identified. As shown by both cross-section 400b and 400c, circuit board 400 may be implemented with a series of layers. According to various embodiments, layers 432, 434, 436, and 438 are implemented as conductive materials, such as copper for example. In other embodiments, layers 432, 434, 436, and 438 may be different types of conductive materials, all the same, or some combination of materials. Layers 442 and 446 may be implemented as a laminate, such as a high frequency laminate. In a specific embodiment, layers 442 and 446 may be implemented as a laminate from Rogers Corporation, belonging to the RO3000 family of laminates and, in some embodiments, particularly RO3003. Further, layer 444 may also be implemented as a laminate. In specific embodiments, layer 444 may be implemented as a fiberglass and epoxy laminate, such as FR-4, for example. In the specific embodiment where layer 444 is composed of FR-4 and layers 442 and 446 are composed of RO3003, the resulting circuit board may exhibit good RF performance due to the RO3003 while being flexible and cost effective due to the FR-4. In other embodiments, the laminates in layers 442, 444, and 446 may be implemented as any type of dielectric, insulating material, plastic, epoxy, fiberglass, structural material, or any combination thereof.

In various embodiments, layers 432, 434, 436, 438, 442, 444, and 446 are selected in order to balance various performance characteristics. In particular, the materials and thicknesses of layers 432, 434, 436, 438, 442, 444, and 446 may be selected in order to: (1) have a proper hardness, (2) provide good RF signal performance, (3) provide good electrical performance, and (4) remain cost effective. With respect to hardness, layers 432, 434, 436, 438, 442, 444, and 446 may be chosen to maintain good structural support without being too hard. If the materials chosen are too hard, cracking and other failure mechanisms may occur within circuit board 400. With respect to signal performance, electrical performance and cost, materials with good electrical and RF, performance may be selected, but a balance of cost effective materials may also be considered. The specific layers described above, including FR-4 and Rogers RO3003 may be particularly suitable in various high frequency embodiments. In some embodiments, some of all of these considerations may not be taken into account.

According to various embodiments, the various layers in circuit board 400 may have any thickness. In some embodiments, the thicknesses of the specific layers may take on the following ranges: layer 432 is between about 25 μm and about 50 μm, layer 434 is between about 50 μm and about 100 μm, layer 436 is between about 25 μm and about 50 μm, layer 438 is between about 50 μm and about 100 μm, layer 442 is between about 100 μm and about 150 μm, layer 444 is between about 100 μm and about 300 μm, and layer 446 is between about 100 μm and about 150 μm. In a specific embodiment, the thickness of each layer may be implemented according to the following: layer 432 is about 35 μm, layer 534 is about 70 μm, layer 436 is about 35 μm, layer 438 is about 70 μm, layer 442 is about 130 μm, layer 444 is about 165 μm, and layer 446 is about 130 μm.

As shown in FIG. 4, through via 404 may be connected between a top surface of circuit board 400 to a bottom surface of circuit board 400. Blind via 406 may be connected from the top surface of circuit board 400 to an intermediate layer, such as layer 446 as shown. In other embodiments, blind via 406 may be connected from the bottom surface of circuit board 400 to an intermediate layer, such as layer 442. In various embodiments, both through via 404 and blind via 406 are filled with an electrically and thermally conductive material, such as copper for example.

Figure 5A:
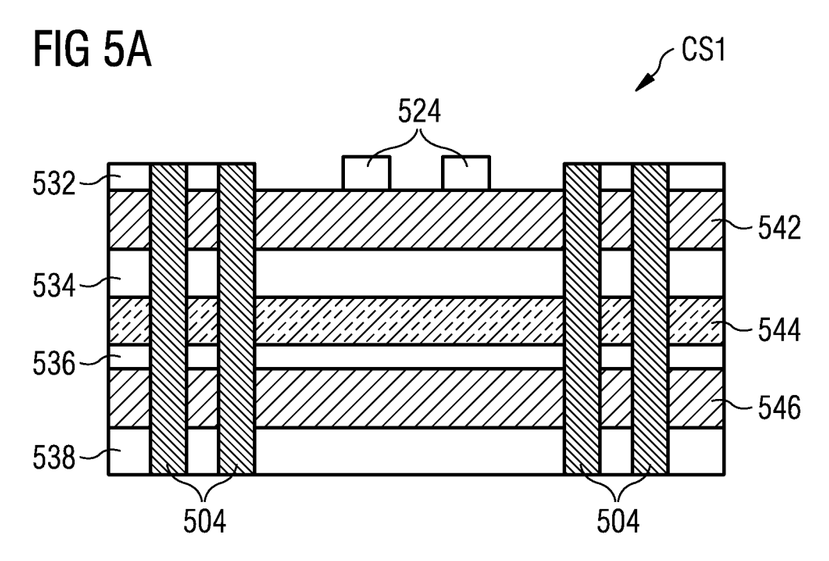
FIG. 5a illustrates a layered cross-section of an embodiment circuit board at a first location.

FIG. 5a illustrates a layered cross-section CS1 of embodiment circuit board 200 at the location of cross-section CS1 as indicated in FIG. 2. According to various embodiments, two sets of through vias 504 form a wall or a shield on each side of differential pair 524. In various embodiments, through vias 504 and differential pair 524 correspond to through vias 204 and differential transmission line 224 in FIG. 2. In various embodiments, layers 532, 534, 536, and 538 are formed of a conductive material, such as copper for example, and layers 542, 544, and 546 are formed of laminate materials, such as RO3003, FR-4, and RO3003, respectively. The various thicknesses of layers 532, 534, 536, 538, 542, 544, and 546 may be implemented according to the thicknesses described in reference to layers 432, 434, 436, 438, 442, 444, and 446 in FIG. 4.

Figure 5B:
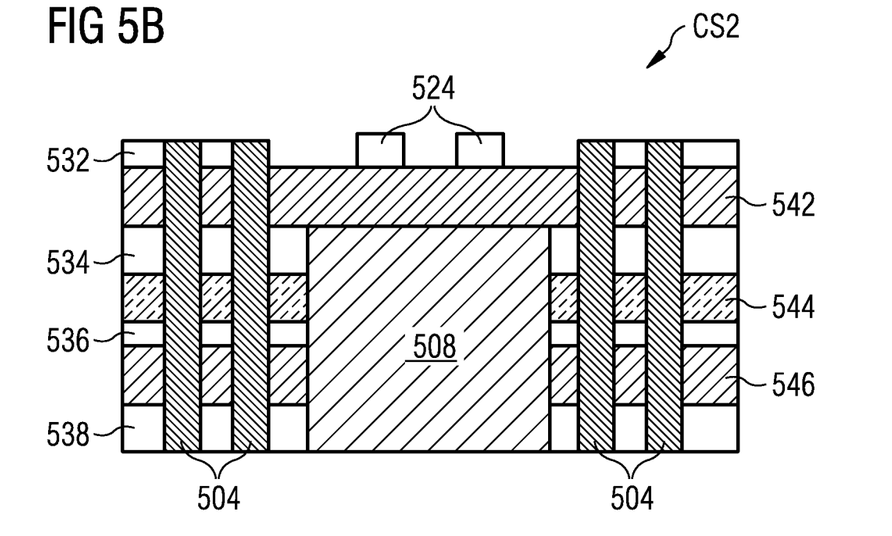
FIG. 5b illustrates a layered cross-section of an embodiment circuit board at a second location.

FIG. 5b illustrates a layered cross-section CS2 of embodiment circuit board 200 at the location of cross-section CS2 as indicated in FIG. 2. Layers 532, 534, 536, 538, 542, 544, and 546 and through vias 504 are consistent or similar to those in cross-section CS1 as shown in FIG. 5a. In the embodiment shown in FIG. 5b, cross-section CS2 is taken at a point where differential pair 524 overlies cavity 508. Cavity 508 may be a cavity of type WR-12 or WR-15. In various embodiments, cavity 508 corresponds to cavity 208 in FIG. 2. As shown, cavity 508 extends from layer 542 down to a bottom surface of the circuit board, corresponding to circuit board 200 in FIG. 2, composed of layer 538. In various embodiments, cavity 508 may guide RF signals through the cavity either to or from differential transmission lines 524 and waveguide transition 220 (not shown at cross-section CS2). In such embodiments, through vias 504 on both sides of cavity 508 may form effective walls for a waveguide including cavity 508 and through vias 504. In various embodiments, cavity 504 is not plated with any type of conductive material, such as gold for example.

Figure 5C:
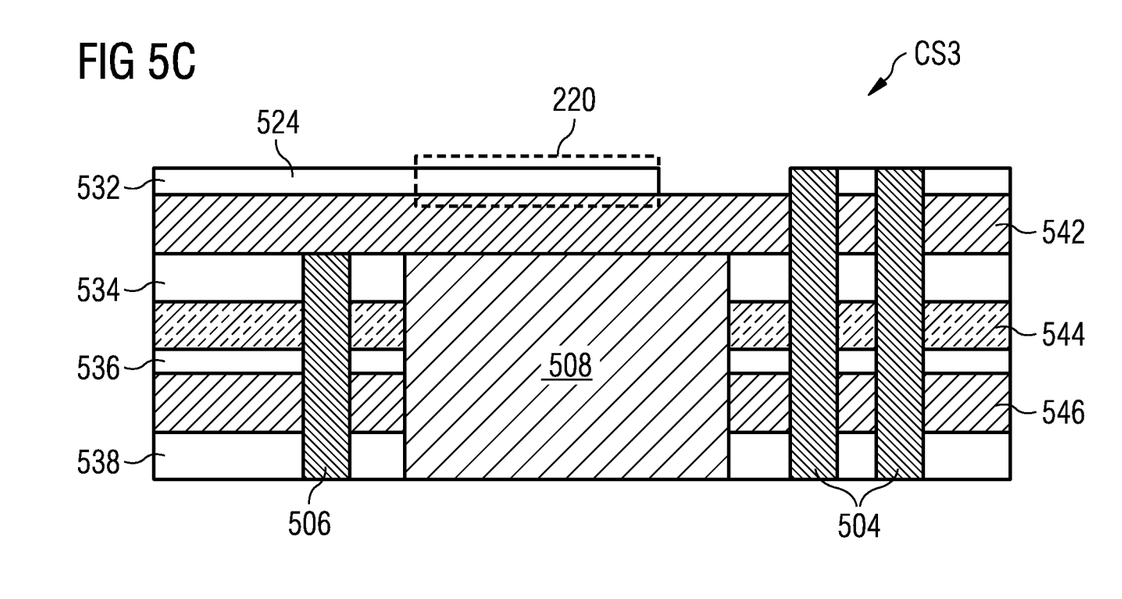
FIG. 5c illustrates a layered cross-section of an embodiment circuit board at a third location.

FIG. 5c illustrates a layered cross-section CS3 of embodiment circuit board 200 at the location of cross-section CS3 as indicated in FIG. 2. Layers 532, 534, 536, 538, 542, 544, and 546 and through vias 504 are consistent or similar to those in cross-section CS1 as shown in FIG. 5a. As shown in FIG. 5c, cross-section CS3 is a lengthwise cut in parallel with differential transmission lines 524. Here cavity 508 is shown as a square cavity that extends from a region adjacent blind via 506 to a region adjacent through vias 504. As described in reference to FIG. 5b, cavity 508 may form a waveguide with conductive walls provided by through vias 504 as well as blind via 506. Multiple blind vias may be included as indicated in other figures. In various embodiments, differential pair 524 may terminate in a region overlying cavity 508. Layer 532 may form waveguide transition 220 as indicated in FIG. 2 in a region overlying cavity 508. Thus, differential pair may transition into the waveguide somewhere over cavity 508, as shown in FIG. 2.

According to various embodiments, RF signals propagate through cavity 508 and are received or transmitted at waveguide transition 220 as the interface to electrical signals on differential pair 524.

According to an embodiment, a circuit board includes a signal line on a first conductive layer comprising a first portion extending over a cavity in the circuit board from a first side of the cavity. The circuit board also includes a first plurality of conductive vias surrounding the cavity and the first plurality of vias include at least one blind via disposed adjacent to the first side of the cavity.

In various embodiments, the first portion of the signal line is tapered. The cavity and the plurality of conductive vias may be configured as a waveguide and the first portion of the signal may be configured as a waveguide feed. Further, the waveguide may be configured to operate at a first wavelength and a pitch of the plurality of conductive vias may be less or equal to a quarter of the first wavelength. In some embodiments, the at least one blind via is disposed below the signal line. The signal line may be disposed on a top conductive layer of the circuit board, the at least one blind via may include a via extending from a bottom conductive layer of the circuit board to an intermediate conductive layer of the circuit board, and the first plurality of conductive vias may further include vias extending from the bottom conductive layer of the circuit board to the top conductive layer of the circuit board.

In various embodiments, the circuit board may include an insulating layer disposed between the signal line and the cavity. The insulating layer may include a first high frequency laminate layer. In some embodiments, the circuit board may further include a second high frequency laminate layer and a first FR-4 layer. The signal line may include a second portion configured as a transmission line and a third portion configured as a landing pad for contact to an integrated circuit. Further, the circuit board may include a second plurality of conductive vias disposed adjacent to the second portion of the transmission line. The second plurality of conductive vias may include first conductive vias connecting a top conductive layer of the circuit board to a bottom conductive layer of the circuit board and second conductive vias connecting the top conductive layer of the circuit board to the bottom conductive layer of the circuit board. In such an embodiment, the first conductive vias have a first diameter and the second conductive vias have a second diameter less than the first diameter.

According to an embodiment, a millimeter-wave system includes a circuit board including a contact region with a plurality of landing pads, a transmission line coupled to the first signal landing pad, a first plurality of vias disposed in the contact region adjacent to the transmission line, and a second plurality of vias disposed adjacent to the transmission line. In such an embodiment, the plurality of landing pads are configured to be coupled to a radio-frequency (RF) integrated circuit, the landing pads include a first signal landing pad configured to be coupled to a RF signal interface of the RF integrated circuit, and at least one of the first plurality of vias is disposed adjacent to the first signal landing pad.

In some embodiments, the circuit board includes a first plurality of vias disposed in the contact region adjacent to the landing pads and further disposed adjacent to the transmission line, wherein at least one of the first plurality of vias is disposed adjacent to the first signal landing pad, a first subset of the first plurality of vias have a first diameter, and a second subset of the first plurality of vias have a second diameter that is shorter than the first diameter.

In various embodiments, the millimeter-wave system includes the RF integrated circuit. The first plurality of vias and the second plurality of vias may include a via connected between a top conductive layer of the circuit board and a bottom conductive layer of the circuit board. Further, the first plurality of vias and a first subset of the second plurality of vias may have a first diameter and a second subset of the second plurality of vias may have a second diameter that is less than the first diameter. In some embodiments, the RF signal interface of the RF integrated circuit is configured to operate at a first wavelength, and a pitch of the first plurality of vias and a pitch of the second plurality of vias is less than a quarter of the first wavelength.

In various embodiments, the circuit board includes an FR-4 layer disposed between a first high frequency laminate layer and a second high frequency laminate layer. The circuit board may also include a first conductive layer disposed above the first high frequency laminate layer, a second conductive layer disposed between the first high frequency laminate layer and the FR-4 layer, a third conductive layer disposed between the FR-4 layer and the second high frequency laminate layer, and a fourth conductive layer disposed below the second high frequency laminate layer. The first conductive layer, the second conductive layer, the third conductive layer, and the fourth conductive layer may include copper.

In various embodiments, the circuit board may also include a waveguide coupled to the transmission line. The waveguide may include a waveguide transition element coupled to the transmission line and a first plurality of conductive vias surrounding the cavity. In such an embodiment, the waveguide transition element includes a signal line on a first conductive layer having a first portion extending over a cavity in the circuit board from a first side of the cavity and the first plurality of vias include at least one blind via disposed adjacent to the first side of the cavity.

In various embodiments, the first plurality of vias are configured to thermally couple the RF integrated circuit to a conductive layer disposed on the circuit board opposite the contact region. The plurality of landing pads may include 119 landing pads configured to receive 119 solder balls.

According to an embodiment, a method of operating a millimeter-wave system includes transmitting an RF signal from an integrated circuit to a transmission line via a landing pad disposed adjacent to a first plurality of electrically and thermally conductive vias disposed adjacent to the landing pads on a circuit board and transitioning the RF signal from the transmission line to a waveguide disposed in a cavity of a circuit board via a waveguide transition element coupled to the transmission line. In such an embodiment, the waveguide transition element includes a signal line on a first conductive layer having a first portion extending over a cavity in the circuit board from a first side of the cavity and the waveguide further includes a first plurality of conductive vias surrounding the cavity. The first plurality of vias include at least one blind via disposed adjacent to the first side of the cavity.

According to various embodiments described herein, advantages may include heat dissipation throughout a system including a circuit board, structural strength and flexibility, stable and firmly coupled ground connections throughout a circuit board, and EMR shielding and transmission along differential signal lines and in waveguides without plated cavity walls.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit board comprising:
    a signal line comprising at least a portion of a first conductive layer, wherein the signal line has a first portion extending over a cavity in the circuit board from a first side of the cavity, and wherein the signal line further comprises:
        a second portion configured as a transmission line; and
        a third portion configured as a landing pad for contact to an integrated circuit;
    a first plurality of conductive vias surrounding the cavity, wherein the first plurality of conductive vias comprise at least one blind via disposed adjacent to the first side of the cavity; and
    a second plurality of conductive vias disposed adjacent to the second portion of the transmission line.

2. The circuit board of claim 1, wherein the first portion of the signal line is tapered.

3. The circuit board of claim 1, wherein:
    the cavity and the first plurality of conductive vias are configured as a waveguide; and
    the first portion of the signal line is configured as a waveguide feed.

4. The circuit board of claim 3, wherein:
    the waveguide is configured to operate at a first wavelength; and
    a pitch of the first plurality of conductive vias is less than or equal to a quarter of the first wavelength.

5. The circuit board of claim 1, wherein the at least one blind via is disposed below the signal line.

6. The circuit board of claim 1, wherein the second plurality of conductive vias comprise:
    first conductive vias connecting a top conductive layer of the circuit board to a bottom conductive layer of the circuit board, wherein the first conductive vias have a first diameter; and
    second conductive vias connecting the top conductive layer of the circuit board to the bottom conductive layer of the circuit board, wherein the second conductive vias have a second diameter less than the first diameter.

7. The circuit board of claim 1, further comprising an insulating layer disposed between the signal line and the cavity.

8. The circuit board of claim 7, wherein the insulating layer comprises a first high frequency laminate layer.

9. A circuit board comprising:
    a signal line comprising at least a portion of a first conductive layer, wherein the signal line has a first portion extending over a cavity in the circuit board from a first side of the cavity;
    a first plurality of conductive vias surrounding the cavity, wherein the first plurality of conductive vias comprise at least one blind via disposed adjacent to the first side of the cavity;
    an insulating layer disposed between the signal line and the cavity, wherein the insulating layer comprises a first high frequency laminate layer; and
    a second high frequency laminate layer and a first FR-4 layer.

10. A circuit board comprising:
    a signal line comprising at least a portion of a first conductive layer, wherein the signal line has a first portion extending over a cavity in the circuit board from a first side of the cavity;
    a first plurality of conductive vias surrounding the cavity, wherein the first plurality of conductive vias comprise at least one blind via disposed adjacent to the first side of the cavity, and wherein the at least one blind via is disposed below the signal line; and
    wherein:
        the first conductive layer is a top conductive layer of the circuit board;
        the at least one blind via comprises a via extending from a bottom conductive layer of the circuit board to an intermediate conductive layer of the circuit board; and
        the first plurality of conductive vias further comprise vias extending from the bottom conductive layer of the circuit board to the top conductive layer of the circuit board.

11. A method of operating a millimeter-wave system comprising:
    transmitting an RF signal from an integrated circuit to a transmission line via a landing pad disposed adjacent to a first plurality of electrically and thermally conductive vias disposed adjacent to the landing pad on a circuit board; and
    transitioning the RF signal from the transmission line to a waveguide disposed in a cavity of a circuit board via a waveguide transition element coupled to the transmission line, wherein
        the waveguide transition element comprises a signal line comprising at least a portion of a first conductive layer, wherein the signal line has a first portion extending over a cavity in the circuit board from a first side of the cavity,
        the waveguide further comprises a second plurality of electrically and thermally conductive vias surrounding the cavity, wherein the second plurality of electrically and thermally conductive vias comprise at least one blind via disposed adjacent to the first side of the cavity, and
        the first plurality of electrically and thermally conductive vias comprises
            first conductive vias connecting a top conductive layer of the circuit board to a bottom conductive layer of the circuit board, wherein the first conductive vias have a first diameter, and
            second conductive vias connecting the top conductive layer of the circuit board to the bottom conductive layer of the circuit board, wherein the second conductive vias have a second diameter that is less than the first diameter.

12. A millimeter-wave system comprising:
    a circuit board comprising
        a contact region comprising a plurality of landing pads configured to be coupled to a radio-frequency (RF) integrated circuit, where the plurality of landing pads comprises a first signal landing pad configured to be coupled to a RF signal interface of the RF integrated circuit;
        a transmission line coupled to the first signal landing pad; and
        a first plurality of vias disposed in the contact region adjacent to the plurality of landing pads and further disposed adjacent to the transmission line, wherein at least one of the first plurality of vias is disposed adjacent to the first signal landing pad,
a first subset of the first plurality of vias comprise a first diameter, and
a second subset of the first plurality of vias comprise a second diameter that is smaller than the first diameter.

13. The millimeter-wave system of claim 12, wherein the plurality of landing pads are configured to receive 119 solder balls.

14. The millimeter-wave system of claim 12, further comprising the RF integrated circuit.

15. The millimeter-wave system of claim 12, wherein the first plurality of vias comprises a via connected between a top conductive layer of the circuit board and a bottom conductive layer of the circuit board.

16. The millimeter-wave system of claim 12, wherein at least one of the second subset of the first plurality of vias is disposed within the contact region.

17. The millimeter-wave system of claim 12, wherein:
the RF signal interface of the RF integrated circuit is configured to operate at a first wavelength; and
a pitch of the first plurality of vias is less than a quarter of the first wavelength.

18. The millimeter-wave system of claim 12, wherein the circuit board comprises an FR-4 layer disposed between a first high frequency laminate layer and a second high frequency laminate layer.

19. The millimeter-wave system of claim 18, wherein the circuit board further comprises:
a first conductive layer disposed above the first high frequency laminate layer;
a second conductive layer disposed between the first high frequency laminate layer and the FR-4 layer;
a third conductive layer disposed between the FR-4 layer and the second high frequency laminate layer; and
a fourth conductive layer disposed below the second high frequency laminate layer.

20. The millimeter-wave system of claim 19, wherein the first conductive layer, the second conductive layer, the third conductive layer and the fourth conductive layer comprise copper.

21. The millimeter-wave system of claim 12, further comprising a waveguide coupled to the transmission line.

22. The millimeter-wave system of claim 21, wherein the waveguide comprises:
a waveguide transition element coupled to the transmission line, the waveguide transition element comprising a signal line on a first conductive layer having a first portion extending over a cavity in the circuit board from a first side of the cavity; and
a second plurality of vias surrounding the cavity, wherein the second plurality of vias comprise at least one blind via disposed adjacent to the first side of the cavity.

23. The millimeter-wave system of claim 12, wherein a portion of the first plurality of vias disposed in the contact region are configured to thermally couple the RF integrated circuit to a conductive layer disposed on the circuit board opposite the contact region.

24. The millimeter-wave system of claim 12, wherein a first subset of the plurality of landing pads are connected together by a continuous region of a top conductive layer of the circuit board.

25. The millimeter-wave system of claim 24, wherein the first subset of the plurality of landing pads comprise at least 27 landing pads.

* * * * *